United States Patent
Ho et al.

(10) Patent No.: US 7,223,687 B1
(45) Date of Patent: May 29, 2007

(54) PRINTED WIRING BOARD AND METHOD OF FABRICATING THE SAME

(75) Inventors: Chung W. Ho, Taipei (TW); Shih-Lian Cheng, Tainan (TW); Leo Shen, Hsinchu (TW)

(73) Assignee: Subtron Technology Co., Ltd., Hsinchu (TW)

( * ) Notice: Subject to any disclaimer, the term of this patent is extended or adjusted under 35 U.S.C. 154(b) by 0 days.

(21) Appl. No.: 11/465,873

(22) Filed: Aug. 21, 2006

(30) Foreign Application Priority Data

Dec. 29, 2005 (TW) .............................. 94147149 A

(51) Int. Cl.
*H01L 21/4763* (2006.01)
(52) U.S. Cl. .................... 438/622; 29/829; 29/830; 438/624
(58) Field of Classification Search ........ 438/622–625; 29/829–853
See application file for complete search history.

(56) References Cited

U.S. PATENT DOCUMENTS

2005/0150686 A1* 7/2005 Powell .................. 174/262

* cited by examiner

*Primary Examiner*—H. Jey Tsai
(74) *Attorney, Agent, or Firm*—J.C. Patents

(57) ABSTRACT

A method of fabricating a printed wiring board comprising the following steps is provided. A portion of each of two dielectric layers or metal layers bonds to both sides of a carrier plate, respectively. Two build-up wiring structures are respectively formed on the dielectric layers or the metal layers by a build-up process. The portions of the dielectric layers or metal layers bonded to the carrier plate are removed such that the dielectric layers or metal layers and the build-up wiring structures formed thereon are released from the carrier plate to form two printed wiring boards.

15 Claims, 5 Drawing Sheets

PRINTED WIRING BOARD AND METHOD OF FABRICATING THE SAME

CROSS-REFERENCE TO RELATED APPLICATION

This application claims the priority benefit of Taiwan application serial no. 94147149, filed on Dec. 29, 2005. All disclosure of the Taiwan application is incorporated herein by reference.

BACKGROUND OF THE INVENTION

1. Field of the Invention

The present invention generally relates to a printed wiring board, and more particularly, to a printed wiring board and method of fabricating the same.

2. Description of Related Art

The common printed wiring board is usually fabricated by lamination or build-up process. In the conventional lamination process, a predetermined number of the single-sided boards or the double-sided boards are provided. Wherein, the single-sided board means that a dielectric layer has a single conductive layer formed thereon, and the double-sided board means that a dielectric layer has two conductive layers formed on its two surfaces thereof respectively. Next, the conductive layers of the single-sided boards or the double-sided boards are patterned. Next, uncured resins are stacked between the single-sided boards or the double-sided boards having the patterned conductive layers to form a lamination structure. Finally, conductive through vias are formed in the lamination structure to electrically connect the patterned conductive layers. Thus, a printed wiring board is fabricated by a lamination process.

It should be noted that the uncured resin is subjected to a high temperature bake process to cure the dielectric layers. Accordingly, if the printed wiring board is fabricated by the lamination process, the structure of the printed wiring board must be symmetrical in thickness and number of layers with respect to the uncured resin in order to prevent the dielectric layer made of resin from warping because it shrinks when cured.

Compared to the above-mentioned lamination process, another conventional lamination process uses—the build-up of B-stage dielectric layers and conductive layers on two sides of a core layer sequentially and symmetrically. Next, the conductive layers are patterned to make via openings. Next, a plurality of openings are formed in the dielectric layers by laser, and then the openings are filled with a conductive material to form a plurality of conductive vias, such that the conductive layers on both sides of the dielectric layer can be electrically connected to each other through the conductive vias. Then, the conductive traces are made by patterning the metal layers.

FIG. 1 is a schematic cross-sectional view showing a conventional build-up printed wiring board. Referring to FIG. 1, a conventional metal patterning process is used to form a conductive layer 12 on both sides of a core layer 10 of the dielectric material. First, a plurality of conductive through vias 14 is formed in the core layer 10 to electrically connect the conductive layers 12. Next, the conductive layers 12 formed on both sides of the core layer 10 are patterned. A B-stage dielectric layer 16 with a copper foil 20 is built up on both sides of the core layer of 10 and 12 by a lamination process. Next, a plurality of blind vias 18 is formed in the top and bottom metal foils 20 and dielectric layers 16, respectively, and then a plating step is used to electrically connect layers 12 and 20 through vias 18.

Next, the two conductive layers 20 on the two dielectric layers 16 are patterned. Finally, the above-mentioned dielectric layers 16, the conductive blind vias 18 and the conductive layers 20 are duplicated to form a build-up printed wiring board 22 according to the required number of the conductive layers.

It should be noted that when the B stage dielectric layer is comprised of a thermosetting resin material, the dielectric layer must be subjected to a high temperature bake process in order to cure the dielectric layer. During the curing step, the B-stage dielectric shrinks and causes a stress in the structure. Accordingly, during the build-up process, the patterned conductive layers and the dielectric layers formed on two sides of the core layer must be symmetrical to avoid the dielectric layers from being warped when they are cured. Therefore, an even number of the patterned conductive layers is required. However, it is desirable for applications such as portable electronics to reduce the thickness of the printed wiring board and to increase the integration thereof. Besides, the core layer serves as a carrier plate for supporting the patterned conductive layers and the dielectric layers in the build-up process. However, the core layer has a definite thickness which, together with the build up layers on both sides, may result in a thickness exceeding the maximal allowable value required by some products.

SUMMARY OF THE INVENTION

Accordingly, one purpose of the present invention is to provide a method of fabricating printed wiring boards comprising odd or even number of patterned conductive layers.

A second purpose of the present invention is to provide a method of fabricating two printed wiring boards in a single process.

A third purpose of the present invention is to provide a printed wiring board with reduced thickness.

A fourth purpose of the present invention is to provide a printed wiring board for enhancing the integration of the printed wiring board.

As embodied and broadly described herein, the present invention provides a method of fabricating printed wiring boards. First, a carrier plate having a first supporting surface and an opposite second supporting surface is provided. The first supporting surface has a first release region and a first bonding region, and the second supporting surface has a second release region and a second bonding region. A first release layer and a second release layer are arranged on the first release region and the second release region, respectively. A first dielectric layer and a second dielectric layer are arranged on the first release layer and the second release layer, respectively. The first and the second dielectric layer are patterned according to a design required by the specification of the PWB. A first conductive layer and a second conductive layer are arranged on the first dielectric layer and the second dielectric layer, respectively. A portion of the first dielectric layer bypassing the first release layer bonds to the first bonding region, and a portion of the second dielectric layer bypassing the second release layer bonds to the second bonding region. A first build-up wiring structure and a second build-up wiring structure are formed on the first conductive layer and the second conductive layer, respectively. A section which the first dielectric layer bonds to the first bonding region is removed, and a section which the second dielectric layer bonds to the second bonding region is removed. The first dielectric layer and the second dielectric layer are released from the first release region and the second release region, respectively, such that a first printed wiring board comprising the first dielectric layer, the first conductive layer and the first build-up wiring structure is formed, and a second printed wiring board comprising the second dielectric layer, the second conductive layer and the second build-up wiring structure is formed.

According to an embodiment of the present invention, an interface between the first dielectric layer and the first release layer has a temporary bonding force, and the method of releasing the first dielectric layer from the first release layer comprises releasing the bonding force between the first dielectric layer and the first release layer. Besides, the first dielectric layer may be mechanically, chemically or physically released from the first release layer. Further, a material of the first release layer comprises dielectric material such as polyethylene terephthalate (PET).

As embodied and broadly described herein, the present invention also provides another method of fabricating printed wiring boards. First, a carrier plate having a first supporting surface and an opposite second supporting surface is provided. The first supporting surface has a first release region and a first bonding region, and the second supporting surface has a second release region and a second bonding region. A first conductive layer and a second conductive layer are arranged on the first release region and the second release region, respectively. A first dielectric layer and a second dielectric layer are arranged on the first conductive layer and the second conductive layer, respectively. A third conductive layer and a fourth conductive layer are arranged on the first dielectric layer and the second dielectric layer, respectively. A portion of the first dielectric layer bypassing the first conductive layer bonds to the first bonding region, and a portion of the second dielectric layer bypassing the second conductive layer bonds to the second bonding region. A first build-up wiring structure and a second build-up wiring structure are formed on the third conductive layer and the fourth conductive layer, respectively. A section which the first dielectric layer bonds to the first bonding region is removed, and a section which the second dielectric layer bonds to the second bonding region is removed. The first conductive layer and the second conductive layer are released from the first release region and the second release region, respectively, such that a first printed wiring board comprising the first conductive layer, the first dielectric layer, the third conductive layer and the first build-up wiring structure is formed, and a second printed wiring board comprises the second conductive layer, the second dielectric layer, the fourth conductive layer and the second build-up wiring structure is formed.

According to an embodiment of the present invention, an interface between the first conductive layer on the release region of the carrier plate and the first release layer has a temporary bonding force, and the method of releasing the first conductive layer from the first release region comprises releasing the bonding force between the first conductive layer and the first release region. The first conductive layer is mechanically, chemically or physically released from the first release region of the carrier plate. The same statement can be made for the second conductive layer to be released from the second release region of the carrier plate.

As embodied and broadly described herein, a printed wiring board comprising a plurality of conductive layers and a plurality of dielectric layers is provided. The conductive layers and the dielectric layers are alternatively stacked, and the printed wiring board comprises at least one conductive blind via for electrically connecting at least two of the conductive layers, wherein one end of the conductive blind via is open and the other end of the conductive blind via is closed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
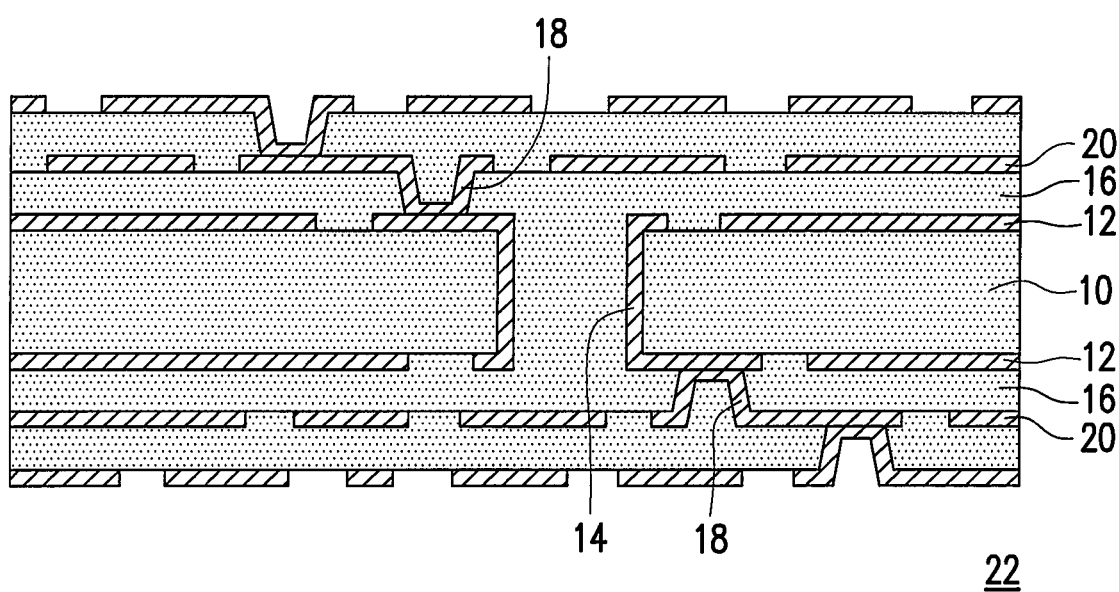
FIG. 1 is a schematic cross-sectional view showing a conventional build-up printed wiring board.

Reference will now be made in detail to the present preferred embodiments of the invention, examples of which are illustrated in the accompanying drawings. Wherever possible, the same reference numbers are used in the drawings and the description to refer to the same or like parts.

The following description comprises two embodiments, the first embodiment starts with a release layer made of dielectric material, and the second embodiment starts with a conductive layer adapted for releasing.

Figure 2A:
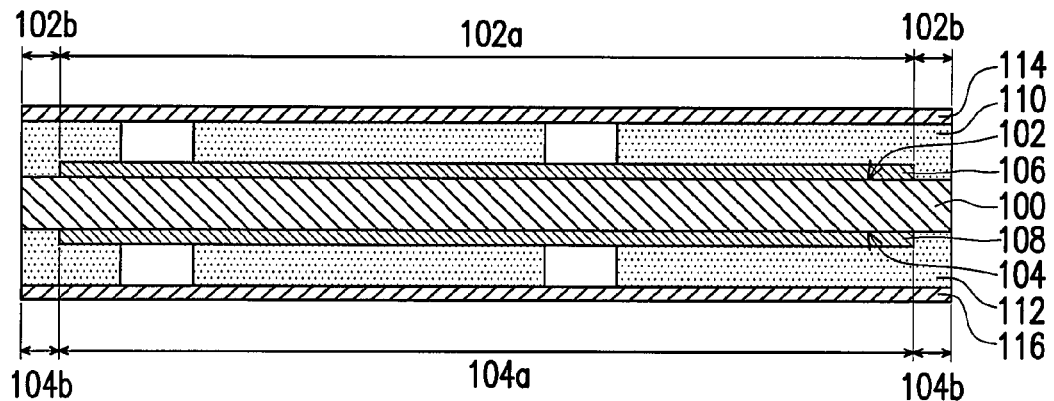
FIGS. 2A to 2E are schematic, cross-sectional diagrams illustrating the process steps for fabricating a printed wiring board according to a first embodiment of the present invention.

FIGS. 2A to 2E are schematic, cross-sectional diagrams illustrating the process steps for fabricating a printed wiring board according to a first embodiment of the present invention. Referring to FIG. 2A, first, a carrier plate 100 having a first supporting surface 102 and a second supporting surface 104 opposite to the first supporting surface 102 is provided. The first supporting surface 102 has a first release region 102a and a first bonding region 102b, and the second supporting surface 104 has a second release region 104a and a second bonding region 104b. The carrier plate 100 may be a thin metal plate such as copper plate.

As shown in FIG. 2A, a first release layer 106 and a second release layer 108 are arranged on the first release region 102a and the second release region 104a, respectively. In the first embodiment, a material of the first release layer 106 and the second release layer 108 may comprise dielectric material such as polyethylene terephthalate (PET).

Figure 2B:
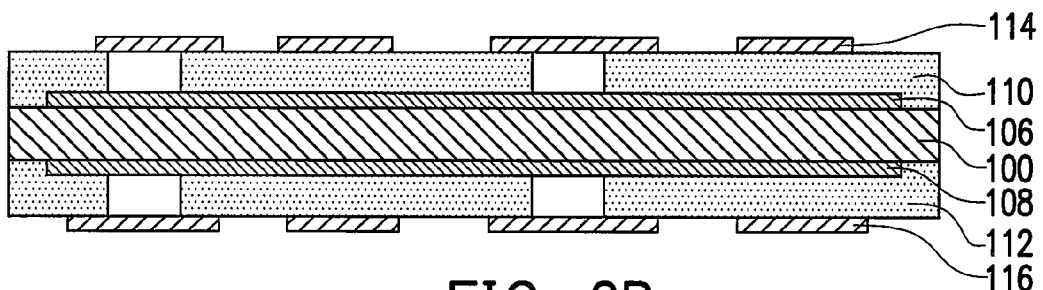

As shown in FIG. 2A, a first dielectric layer 110 and a second dielectric layer 112 are arranged on the first supporting surface 102 and the second supporting surface 104, respectively, and a first conductive layer 114 and a second conductive layer 116 are arranged on the first dielectric layer 110 and the second dielectric layer 112, respectively. Then, a portion of the first dielectric layer 110 bonds to the first bonding region 102b, and a portion of the second dielectric layer 112 bonds to the second bonding region 104b as shown in FIG. 2B, such that the first dielectric layer 110 is fixed on the carrier plate 100 and the second dielectric layer 112 is fixed on the carrier plate 100. In the first embodiment, a portion of the first dielectric layer 110 bypassing the first release layer 106 bonds to the first bonding region 102b, and a portion of the second dielectric layer 112 bypassing the second release layer 108 bonds to the second bonding region 104b. The first dielectric layer 110 and the second dielectric layer 112 can be patterned with vias as shown in FIG. 2A. The first conductive layer 114 and the second conductive layer can be patterned as shown in FIG. 2B.

Figure 2C:
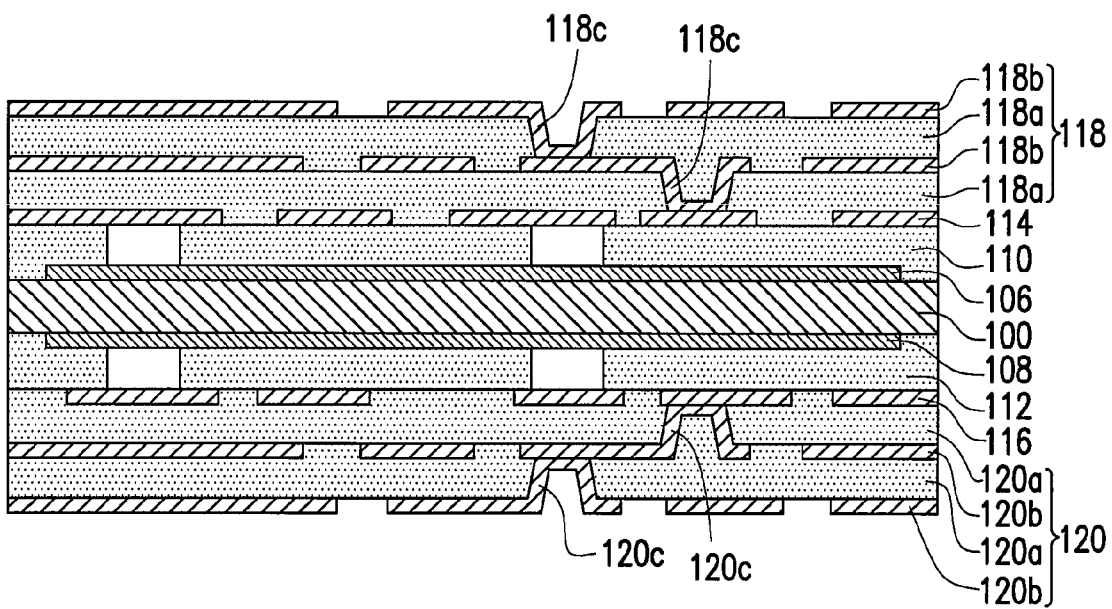

Referring to FIG. 2C, a first build-up wiring structure 118 and a second build-up wiring structure 120 are formed on the first conductive layer 114 and the second conductive layer 116 by build-up, respectively. In the first embodiment, the first build-up wiring structure 118 comprises a plurality of third dielectric layers 118a, a plurality of third conductive layers 118b and a plurality of first conductive blind vias 118c. The first conductive blind vias 118c are adapted for electrically connecting the first conductive layer 114 and the third conductive layers 118b, respectively. Similarly, the second build-up wiring structure 120 comprises a plurality of fourth dielectric layers 120a, a plurality of fourth conductive layers 120b and a plurality of second conductive blind vias 120c. The first conductive blind vias 120c are adapted for electrically connecting the second conductive layer 116 and the fourth conductive layers 120b, respectively.

In another embodiment, the number of the dielectric layers, the conductive layers and the conductive blind vias of the first build-up wiring structure 118 and the second build-up wiring structure 120 can be adjusted according to the requirements.

Figure 2D:
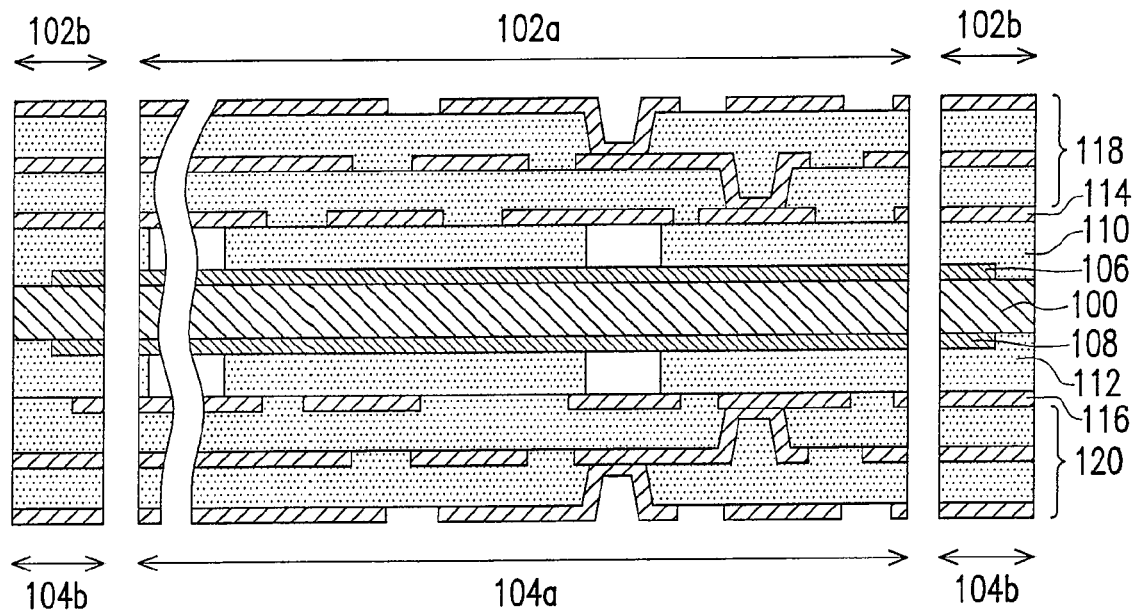

Referring to FIG. 2D, after the first build-up wiring structure 118 and the second build-up wiring structure 120 are formed, a section which the first dielectric layer 110 bonds to the first bonding region 102b is removed, and a section which the second dielectric layer 112 bonds to the second bonding region 104b is removed so that the first dielectric layer 110 and the second dielectric layer 112 do not fix on the carrier plate 100. In the above-mentioned step, a portion of the first build-up wiring structure 118, a portion of the first conductive layer 114, a portion of the carrier plate 100, a portion of the second conductive layer 116 and a portion of the second build-up wiring structure 120 can be removed simultaneously. In the first embodiment, a portion of the first release layer 106 and a portion of the second release layer 108 can also be removed simultaneously to make sure that the first dielectric layer 110 and the second dielectric layer 112 are separated from the carrier plate 100.

Figure 2E:
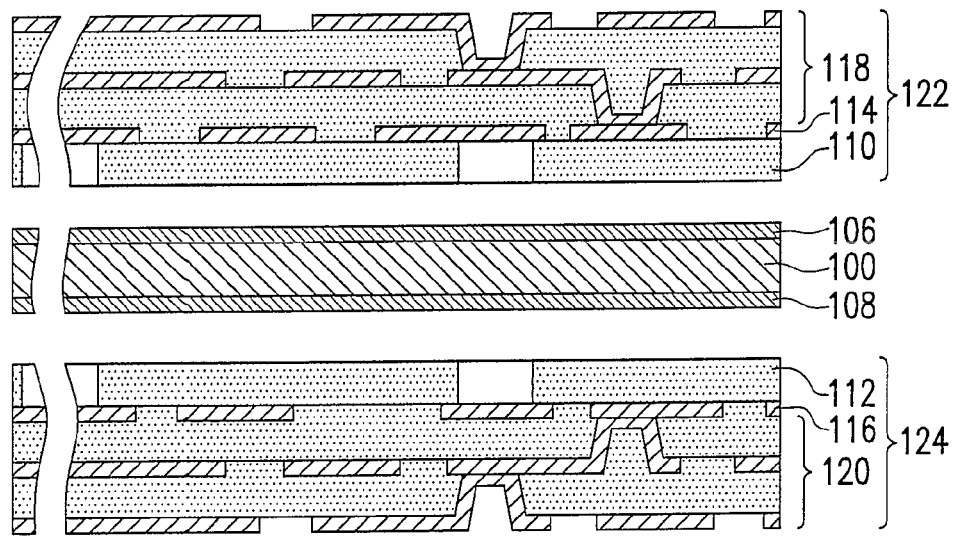

As shown in FIG. 2E, after a section which the first dielectric layer 110 bonds to the first bonding region 102b and a section which the second dielectric layer 112 bonds to the second bonding region 104b are removed, the first dielectric layer 110 and the second dielectric layer 120 are released from the first release region 102a and the second release region 104a, respectively, such that a first printed wiring board 122 comprising the first dielectric layer 110, the first conductive layer 114 and the first build-up wiring structure 118 is formed, and a second printed wiring board 124 comprising the second dielectric layer 112, the second conductive layer 116 and the second build-up wiring structure 120 is formed. Thus far, two printed wiring boards are formed in a single process in the first embodiment (it means the first printed wiring board 122 and the second printed wiring board 124).

It should be noted that the interface between the first dielectric layer 110 and the first release layer 106 has a temporary bonding force in the first embodiment. Accordingly, the method of releasing the first dielectric layer 110 from the first release layer 106 comprises releasing the bonding force between the first dielectric layer 110 and the first release layer 106. The first dielectric layer 110 can be mechanically, chemically or physically released from the first release layer 106. The interface between the second dielectric layer 112 and the second release layer 108 has the similar condition.

Figure 3A:
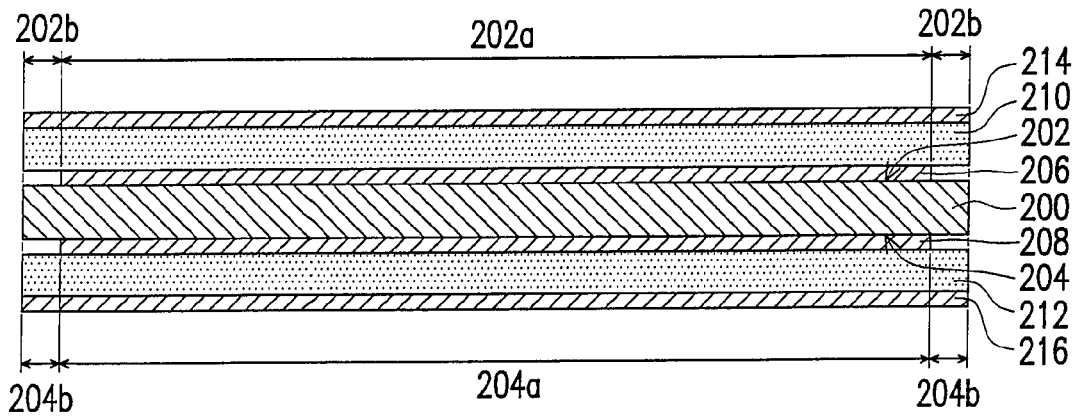
FIGS. 3A to 3E are schematic, cross-sectional diagrams illustrating the process steps for fabricating a printed wiring board according to a second embodiment of the present invention.

FIGS. 3A to 3E are schematic, cross-sectional diagrams illustrating the process flow for fabricating a printed wiring board according to a second embodiment of the present invention. Referring to FIG. 3A, first, a carrier plate 200 having a first supporting surface 202 and a second supporting surface 204 opposite to the first supporting surface 202 is provided according to the second embodiment of the present invention. The first supporting surface 202 has a first release region 202a and a first bonding region 202b, and the second supporting surface 204 has a second release region 204a and a second bonding region 204b. The carrier plate 200 may be a thin metal plate such as copper plate.

As shown in FIG. 3A, a first conductive layer 206 and a second conductive layer 208 are arranged on the first release region 202a and the second release region 204a, respectively. Wherein, a surface of the first conductive layer 206, which faces the first release region 202a of the carrier plate 200, has temporary adhesion; a surface of the second conductive layer 208, which faces the second release region 204a of the carrier plate 200, has temporary adhesion. In the second embodiment, the first conductive layer 206 and the second conductive layer 208 may be comprised of a metal such as copper.

Figure 3B:
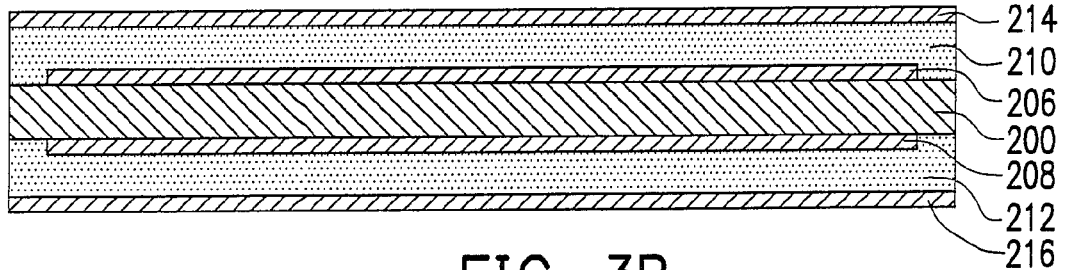

As shown in FIG. 3A, a first dielectric layer 210 and a second dielectric layer 212 are arranged on the first supporting surface 202 and the second supporting surface 204, respectively, and a third conductive layer 214 and a fourth conductive layer 216 are arranged on the first dielectric layer 210 and the second dielectric layer 212, respectively. Next, a portion of the first dielectric layer 210 bonds to the first bonding region 202b, and a portion of the second dielectric layer 212 bonds to the second bonding region 204b by a hot press process as shown in FIG. 3B, such that the first dielectric layer 210 is fixed on the carrier plate 200 and the second dielectric layer 212 is fixed on the carrier plate 200. In the second embodiment, a portion of the first dielectric layer 210 bypassing the first conductive layer 206 bonds to the first bonding region 202b, and a portion of the second dielectric layer 212 bypassing the second conductive layer 208 bonds to the second bonding region 204b. The first dielectric layer 210 and the second dielectric layer 212 bond to the first conductive layer 206 and the second conductive layer 208 made of metal, respectively.

Figure 3C:
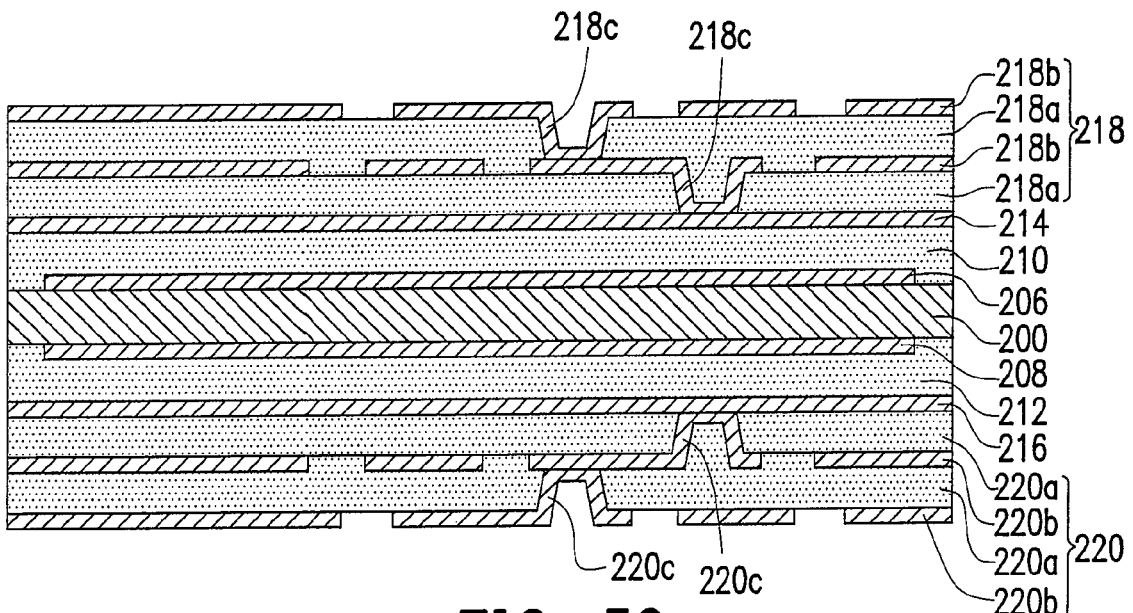

Referring to FIG. 3C, a first build-up wiring structure 218 and a second build-up wiring structure 220 are formed on the third conductive layer 214 and the fourth conductive layer 216 by build-up, respectively. In the second embodiment, the first build-up wiring structure 218 comprises a plurality of third dielectric layers 218a, a plurality of fifth conductive layers 218b and a plurality of first conductive blind vias 218c. The first conductive blind vias 218c are adapted for electrically connecting the third conductive layer 214 and the fifth conductive layers 218b, respectively. Similarly, the second build-up wiring structure 220 comprises a plurality of fourth dielectric layers 220a, a plurality of sixth conductive layers 220b and a plurality of second conductive blind vias 220c. The first conductive blind vias 220c are adapted for electrically connecting the fourth conductive layer 216 and the sixth conductive layers 220b, respectively.

In another embodiment, the number of the dielectric layers, the conductive layers and the conductive blind vias of the first build-up wiring structure 218 and the second build-up wiring structure 220 can be adjusted according to the requirements. Additionally in another embodiment, the first conductive layer 206 and the second conductive layer 208 can be previously patterned to form the circuit pattern before the fabrication of the first dielectric layer 210, and the second dielectric layer 212. Additionally, in another embodiment, the third conductive layer 214 and the fourth conductive layer 216 can be previously patterned to form the required circuit pattern before the fabrication of the first build-up wiring structure 218 and the second build-up wiring structure 220.

Figure 3D:
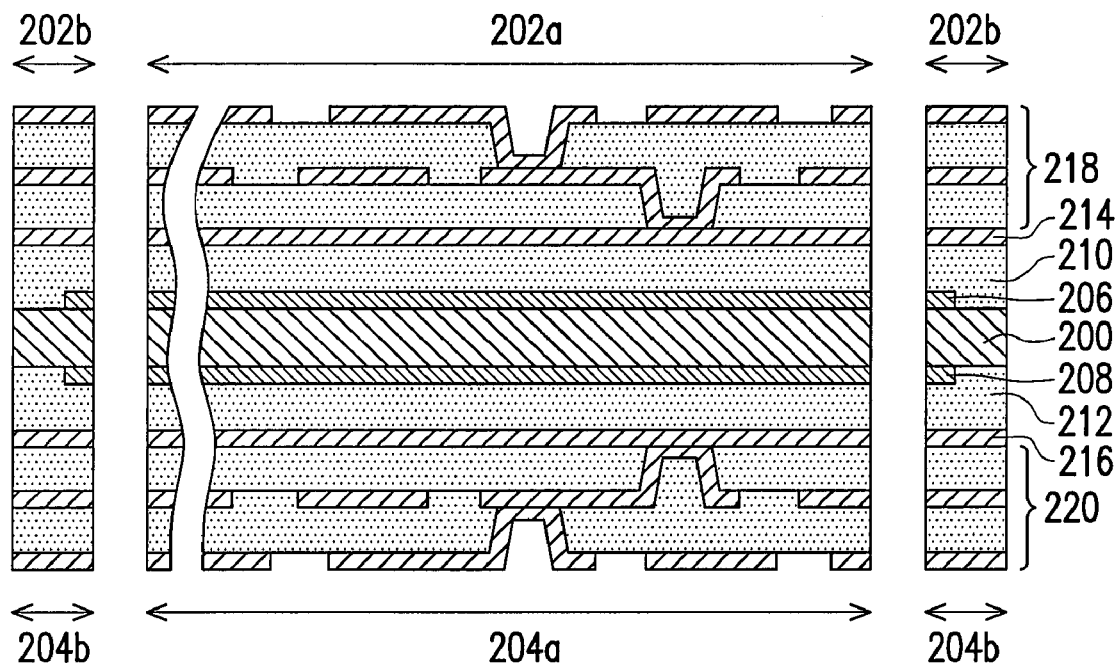

Referring to FIG. 3D, after the first build-up wiring structure 218 and the second build-up wiring structure 220 are formed, a section which the first dielectric layer 210 bonds to the first bonding region 202b is removed, and a section which the second dielectric layer 212 bonds to the second bonding region 204b is removed so that the first dielectric layer 210 and the second dielectric layer 212 do not fix on the carrier plate 200. In the above-mentioned step, a portion of the first build-up wiring structure 218, a portion of the third conductive layer 214, a portion of the carrier plate 200, a portion of the fourth conductive layer 216 and a portion of the second build-up wiring structure 220 can also be removed simultaneously. In the second embodiment, a portion of the first conductive layer 206 and a portion of the second conductive layer 208 can also be removed simultaneously to ensure that the first dielectric layer 210 and the second dielectric layer 212 are separated from the carrier plate 200.

Figure 3E:
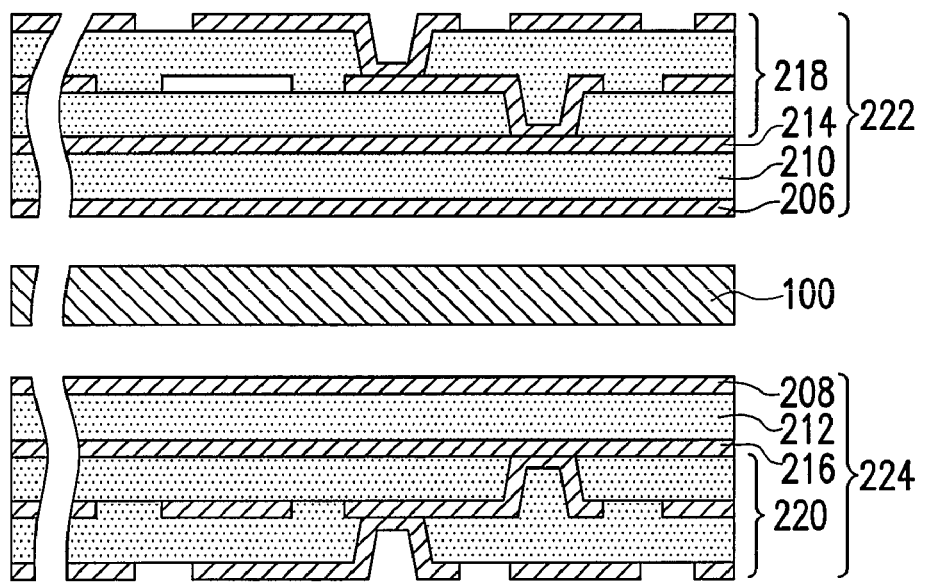

As shown in FIG. 3E, after a section which the first dielectric layer 210 bonds to the first bonding region 202b and a section which the second dielectric layer 212 bonds to the second bonding region 204b are removed, the first conductive layer 206 and the second conductive layer 208 are released from the first release region 202a and the second release region 204a, respectively, such that a first printed wiring board 222 comprising the first conductive layer 206, the first dielectric layer 210, the third conductive layer 214 and the first build-up wiring structure 218 is formed, and a second printed wiring board 224 comprising the second conductive layer 208, the second dielectric layer 212, the fourth conductive layer 216 and the second build-up wiring structure 220 is formed. Thus far, two printed wiring boards are formed in a single process in the second embodiment (it means the first printed wiring board 222 and the second printed wiring board 224).

It should be noted that the interface between the first conductive layer 206 and the first release region 202a has a temporary bonding force in the second embodiment. Accordingly, the method of releasing the first conductive layer 206 from the first release region 202a comprises releasing the bonding force between the first conductive layer 206 and the first release region 202a. The first conductive layer 206 can be mechanically, chemically or physically released from the first release region 202a. The interface between the second conductive layer 208 and the second release region 204a has the similar condition.

The printed wiring boards formed according to the above processes may have the patterned conductive layers in odd or even number. However, there is no need for conductive through holes (as the conductive through hole 14 shown in FIG. 1) formed in the printed wiring boards for electrically connecting the patterned conductive layers, but the printed wiring boards employ the conductive blind vias (as the conductive blind via 18 shown in FIG. 1) for electrically connecting the patterned conductive layers. It should be noted that both ends of the above-mentioned conductive through hole are open, but one end of the conductive blind via is open and the other end of the conductive blind via is closed. Accordingly, referring to FIG. 2E of the first embodiment or FIG. 3E of the second embodiment, the present invention also provides a printed wiring board comprising a plurality of alternatively stacked conductive layers and dielectric layers. The printed wiring board employs the conductive blind vias having smaller outer diameters for electrically connecting the conductive layers instead of the conductive through holes having larger outer diameters.

In summary, the method of fabricating printed wiring boards of the present invention is to bond a portion of two dielectric layers or conductive layers to both surfaces of a carrier plate, respectively. Next, a build-up wiring structure is formed on the two dielectric layers or the two conductive layers by build-up, respectively. Then, the sections, which the two dielectric layers or the two conductive layers bond to the carrier plate, are removed, such that the two dielectric layers or the two conductive layers and the build-up wiring structure formed thereon are released from the carrier plate, to form the two printed wiring boards. Therefore, the present invention has the following advantages:

1. The method of fabricating printed wiring boards of the present invention may be used to fabricate a printed wiring board with any number of the patterned conductive layers as required, such that the number of the patterned conductive layers is not limited to even numbers. This is helpful to reduce the thickness of the printed wiring boards and enhance the integration of the printed wiring boards.

2. The printed wiring board formed according to the above-mentioned process does not have the conventional core layer with a larger thickness, such that the fabrication cost of the printed wiring board may be reduced. Accordingly, the thickness of the printed wiring boards may be reduced and the integration of the printed wiring boards may be enhanced.

3. The printed wiring board formed according to the above-mentioned processes employs the conductive blind vias for electrically connecting the patterned conductive layers instead of the conventional conductive through holes, and therefore this is helpful to enhance the interconnection density of the printed wiring board.

4. The method of fabricating printed wiring boards of the present invention may fabricate two printed wiring boards in a single process, and accordingly this would reduce the fabrication cost of the printed wiring boards.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating printed wiring boards, comprising the following steps:

providing a carrier plate having a first supporting surface and an opposite second supporting surface, the first supporting surface having a first release region and a first bonding region, and the second supporting surface having a second release region and a second bonding region;

arranging a first release layer and a second release layer on the first release region and the second release region, respectively;

arranging a first dielectric layer and a second dielectric layer on the first release layer and the second release layer, respectively;

arranging a first conductive layer and a second conductive layer on the first dielectric layer and the second dielectric layer, respectively;

bonding a portion of the first dielectric layer bypassing the first release layer to the first bonding region, and bonding a portion of the second dielectric layer bypassing the second release layer to the second bonding region;

forming a first build-up wiring structure and a second build-up wiring structure on the first conductive layer and the second conductive layer, respectively;

removing a section which the first dielectric layer bonds to the first bonding region and a section which the second dielectric layer bonds to the second bonding region; and releasing the first dielectric layer and the second dielectric layer from the first release region and the second release region, respectively, such that a first printed wiring board comprising the first dielectric layer, the first conductive layer and the first build-up wiring structure, and a second printed wiring board comprising the second dielectric layer, the second conductive layer and the second build-up wiring structure are formed.

2. The method of fabricating printed wiring boards according to claim 1, wherein an interface between the first dielectric layer and the first release layer has a temporary bonding force, and the method of releasing the first dielectric layer from the first release layer comprises releasing the bonding force between the first dielectric layer and the first release layer.

3. The method of fabricating printed wiring boards according to claim 2, wherein the first dielectric layer is mechanically, chemically or physically released from the first release layer.

4. The method of fabricating printed wiring boards according to claim 1, wherein a material of the first release layer comprises dielectric materials.

5. The method of fabricating printed wiring boards according to claim 1, wherein a material of the first release layer comprises polyethylene terephthalate (PET).

6. The method of fabricating printed wiring boards according to claim 1 wherein the first dielectric layer and the second dielectric layer are patterned.

7. The method of fabricating printed wiring boards according to claim 1 wherein the first conductive layer and the second conductive layer and patterned.

8. The method of fabricating printed wiring boards according to claim 1, wherein the first build-up wiring structure and the second build-up wiring structure consist of one or more alternatively stacked conductive layers and dielectric layers, respectively.

9. A method of fabricating printed wiring boards, comprising the following steps:

providing a carrier plate having a first supporting surface and an opposite second supporting surface, the first supporting surface having a first release region and a first bonding region, and the second supporting surface having a second release region and a second bonding region;

arranging a first conductive layer and a second conductive layer on the first release region and the second release region, respectively;

arranging a first dielectric layer and a second dielectric layer on the first conductive layer and the second conductive layer, respectively;

arranging a third conductive layer and a fourth conductive layer on the first dielectric layer and the second dielectric layer, respectively;

bonding a portion of the first dielectric layer bypassing the first release layer to the first bonding region, and bonding a portion of the second dielectric layer bypassing the second release layer to the second bonding region;

forming a first build-up wiring structure and a second build-up wiring structure on the third conductive layer and the fourth conductive layer, respectively;

removing a section which the first dielectric layer bonds to the first bonding region and a section which the second dielectric layer bonds to the second bonding region; and releasing the first conductive layer and the second conductive layer from the first release region and the second release region, respectively, such that a first printed wiring board comprising the first conductive layer, the first dielectric layer, the third conductive layer and the first build-up wiring structure, and a second printed wiring board comprising the second conductive layer, the second dielectric layer, the fourth conductive layer and the second build-up wiring structure are formed.

10. The method of fabricating printed wiring boards according to claim 9, wherein an interface between the first conductive layer and the first release layer has a temporary bonding force, and the method of releasing the first conductive layer from the first release region comprises releasing the bonding force between the first conductive layer and the first release region.

11. The method of fabricating a printed wiring board according to claim 10, wherein the first dielectric layer is mechanically, chemically or physically released from the first release layer.

12. The method of fabricating a printed wiring board according to claim 9, wherein a material of the first conductive layer comprises metal.

13. The method of fabricating printed wiring boards accord of to claim 9, wherein the first conductive layer and the second conductive layer are patterned.

14. The method of fabricating printed wiring board according to claim 9, wherein the first conductive layer is mechanically, chemically or physically released form the first release layer.

15. The method of fabricating printed wiring boards according to claim 9, wherein a material of the first release layer comprises polyethylene terephthalate (PET).

* * * * *